United States Patent
Payne et al.

(10) Patent No.: US 10,224,413 B1
(45) Date of Patent: Mar. 5, 2019

(54) RADIO-FREQUENCY CARBON-NANOTUBE FIELD EFFECT TRANSISTOR DEVICES WITH LOCAL BACKGATES AND METHODS FOR MAKING SAME

(75) Inventors: Joseph A. Payne, Elkridge, MD (US);
Wayne S. Miller, Hanover, MD (US);
Monica P. Lilly, Frederick, MD (US);
Silai V. Krishnaswamy, Monroeville, PA (US)

(73) Assignee: Northrop Grumman Systems Corporation, Falls Church, VA (US)

(*) Notice: Subject to any disclaimer, the term of this patent is extended or adjusted under 35 U.S.C. 154(b) by 0 days.

(21) Appl. No.: 13/361,461

(22) Filed: Jan. 30, 2012

(51) Int. Cl.
| | |
|---|---|
| *B82Y 40/00* | (2011.01) |
| *H01L 29/66* | (2006.01) |
| *H01L 29/786* | (2006.01) |
| *H01L 29/78* | (2006.01) |

(52) U.S. Cl.
CPC .. *H01L 29/66477* (2013.01); *H01L 29/66742* (2013.01); *H01L 29/78* (2013.01); *H01L 29/78603* (2013.01); *H01L 29/78696* (2013.01); *B82Y 40/00* (2013.01); *Y10S 977/742* (2013.01)

(58) Field of Classification Search
CPC ............... Y10S 977/742; B82Y 40/00; H01L 29/66742; H01L 29/78603; H01L 29/78696
USPC ...... 257/29, 39, E51.038, E23.074; 438/149, 438/69
See application file for complete search history.

(56) References Cited

U.S. PATENT DOCUMENTS

| | | | |
|---|---|---|---|
| 6,660,588 B1* | 12/2003 | Yang et al. | 438/257 |
| 7,601,322 B2* | 10/2009 | Huang | 423/447.2 |
| 7,714,386 B2* | 5/2010 | Pesetski et al. | 257/347 |
| 7,952,088 B2* | 5/2011 | Anderson et al. | 257/24 |
| 8,124,463 B2* | 2/2012 | Chen et al. | 438/149 |
| 8,134,145 B2* | 3/2012 | Lee et al. | 257/40 |
| 8,138,491 B2* | 3/2012 | Appenzeller et al. | 257/9 |
| 2005/0106846 A1* | 5/2005 | Dubin | 438/585 |
| 2005/0212014 A1* | 9/2005 | Horibe et al. | 257/213 |
| 2009/0201743 A1* | 8/2009 | Yang | 365/185.28 |
| 2010/0173462 A1* | 7/2010 | Appenzeller et al. | 438/276 |
| 2011/0212566 A1* | 9/2011 | Portico Ambrosio et al. | 438/69 |
| 2011/0254061 A1* | 10/2011 | Yan et al. | 257/288 |

(Continued)

FOREIGN PATENT DOCUMENTS

JP 63086578 A * 4/1988

OTHER PUBLICATIONS

Engineering Carbon Nanotubes and Nanotube Circiuts Using Electrical Breakdown, Collins, Arnold and Avouris—Apr. 27, 2001 vol. 292 Science.*

(Continued)

*Primary Examiner* — Marcos D Pizarro
(74) *Attorney, Agent, or Firm* — Katten Muchin Rosenman LLP

(57) ABSTRACT

A radio-frequency (RF) carbon-nanotube (CNT) field effect transistor (FET) device. The device includes a source contact, a drain contact, semi-conducting CNTs positioned between the source and drain contacts, high-κ gate dielectric, and a local backgate positioned below the semi-conducting CNTs, in which the local backgate is capable of RF performance and is capable of being used in a backgate burnout process used to enhance the semiconducting to metallic tube ratio of the device.

4 Claims, 4 Drawing Sheets

(56) References Cited

U.S. PATENT DOCUMENTS

2012/0326126 A1\* 12/2012 Chen et al. .................... 257/29
2013/0119349 A1\* 5/2013 Chung et al. .................. 257/29

OTHER PUBLICATIONS

Engineering Carbon Nanotubes and Nanotube Circuits Using Electrical Breakdown Philip G. Collins, Michael S. Arnold, Phaedon Avouris Science Apr. 27, 2001: vol. 292 No. 5517 pp. 706-709 DOI: 10.1126/science.1058782.\*

\* cited by examiner

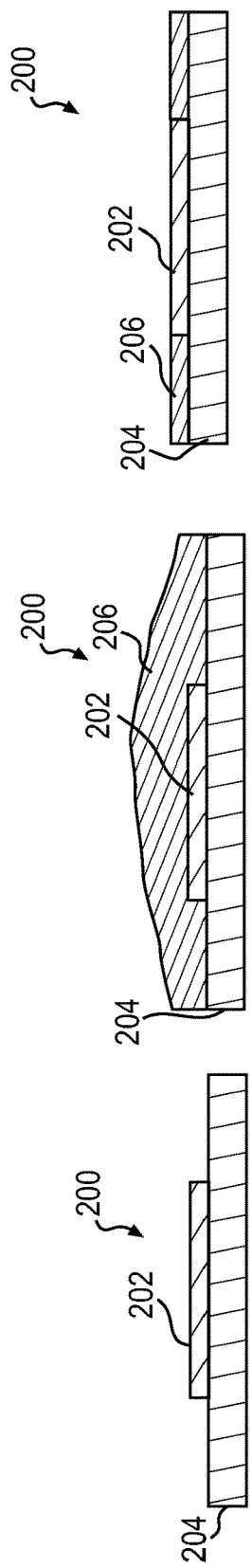

RADIO-FREQUENCY CARBON-NANOTUBE FIELD EFFECT TRANSISTOR DEVICES WITH LOCAL BACKGATES AND METHODS FOR MAKING SAME

BACKGROUND

The current state of the art in the carbon-nanotube (CNT) community is to grow aligned nanotubes on a crystalline quartz substrate. The tubes are then transferred to an oxidized silicon wafer using some variation of a transfer process. Source and drain contacts are typically defined using either i-line or e-beam lithographic techniques while the metal is deposited using an e-beam evaporator. Metallic tube removal is performed using the global silicon wafer as a backgate. This accomplishes the metallic tube removal process, but the global backgate incorporates an enormous parasitic capacitance. This extra gate capacitance prevents these devices from operating at high frequency.

When grown using a standard high-temperature chemical vapor deposition (CVD) based process, one-third (⅓) of the nucleating CNTs grow as metallic tubes while two-thirds (⅔) grow as semi-conducting tubes. Because the metallic tubes have conductance without having any trans-conductance, they are very undesirable from a device standpoint. Removing these tubes has been and is still a very active area of CNT research. The standard method of removing metallic tubes is to place or grow the tubes on a thin oxide coating a conductive wafer (e.g., a heavily doped silicon wafer). The conductive wafer is then used as a global backgate to deplete the semi-conducting tubes before passing a large current through the metallic tubes. In an oxygen environment, this high current will oxidize the metallic tubes, leaving behind most of the depleted semi-conducting tubes.

SUMMARY

Embodiments described herein have numerous advantages, including overcoming the defects of the prior art. These advantages may be achieved by a radio-frequency (RF) carbon-nanotube (CNT) field effect transistor (FET) device. The device includes a source contact, a drain contact, semi-conducting CNTs positioned between the source and drain contacts, and a local backgate positioned below the semi-conducting CNTs, separated by a gate dielectric, in which the local backgate is capable of RF performance.

These advantages may also be achieved by a method of making a radio-frequency (RF) carbon-nanotube (CNT) field effect transistor (FET) device. The method includes depositing a local backgate structure on a RF compatible substrate, depositing high-κ gate dielectric layer on top of the local backgate structure, transferring CNTs onto the high-κ gate dielectric layer in which the CNTs include both metallic and semi-conducting CNTs, depositing source and drain contacts on top of the CNTs, applying a voltage to the local backgate sufficient to deplete the semi-conducting CNTs, and applying a voltage to the source and drain contacts sufficient to burn-out the metallic CNTs, wherein the metallic CNTs are removed.

BRIEF DESCRIPTION OF THE DRAWINGS

The embodiments herein are described with reference to the following drawings, in which like numbers refer to like parts.

FIGS. 2A-2G are block diagrams illustrating an embodiment of a method of making a radio-frequency (RF) carbon-nanotube (CNT) field effect transistor (FET) device with local backgate.

DETAILED DESCRIPTION

Described herein are embodiments of radio-frequency (RF) carbon-nanotube (CNT) field effect transistor (FET) devices with local backgates and methods for making same. Embodiments overcome the problems described above. For example, the local backgate structure is appealing because it solves a number of challenges in the CNT FET community with a single geometry. When constructed with this geometry, the CNTs are both exposed to oxygen and have a gate in-place to deplete the semiconductor tubes for electrical metallic tube removal. Additionally, because the backgate is local, embodiments have much less capacitance and are capable of much better performance when compared to the standard global backgate structures that are currently the standard.

As such, embodiments provide a CNT FET with an enhanced on/off ratio using backgate electrical burnout. The same backgate is used to drive the CNT FET device at RF frequencies. Because the gate is local, the gate-source and gate-drain capacitance is substantially reduced compared to standard global backgate structures.

Figure 1:
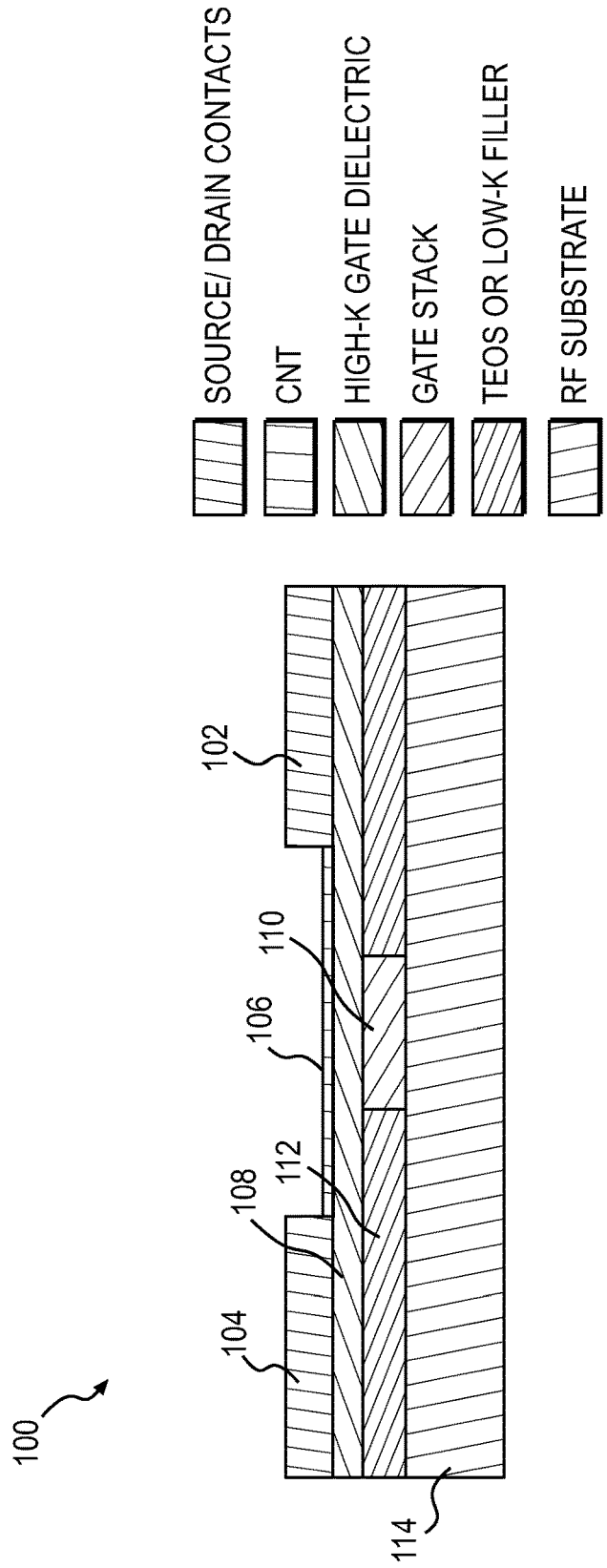
FIG. 1 is a block diagram illustrating an embodiment of a radio-frequency (RF) carbon-nanotube (CNT) field effect transistor (FET) device with local backgate.

With reference now to FIG. 1, shown is exemplary embodiment of a RF CNT FET device with a local backgate 100. Embodiment is a CNT FET with a local backgate, or bottom gate, with tubes that are exposed to oxygen. The local backgate allows metallic tube removal using standard electrical burnout process. Additionally, because the backgate is a local gate with small parasitic capacitance elements, the local backgate is capable of RF performance. Note that the value of the capacitance depends on the exact feature sizes and materials of the specific embodiment of the device 100. Stating that the local backgate has a small parasitic capacitance indicates that a global gate capacitance will dwarf the local backgate capacitance in size, making the global gate solution incapable of high speed performance. In contrast, the local backgate solution reduces these parasitic capacitance values and allows a much higher frequency performance. Instead of lying directly underneath the contacts, as in the global backgate, the local backgate is present only in the channel of the device. This drastically decreases the fringing capacitance between the local backgate and the source, the gate and drain, significantly improving the RF performance.

RF CNT FET device 100 includes source contact 102, drain contact 104, carbon-nanotubes (CNTs) 106, a high-κ gate dielectric layer 108, gate stack (local backgate) 110, a TEOS or low-κ dielectric fill layer 112, and RF substrate 114. Source contact 102 and drain contact 104 may be reversed. As shown, CNTs 106 are exposed to oxygen. High-κ gate dielectric layer 108 is gate layer made using a material with a high dielectric constant κ (e.g., as opposed to silicon dioxide). Using a high-κ material instead of silicon dioxide as the gate material allows for increased gate capacitance without associated leakage effects (which result from tunneling that occurs when a silicon dioxide gate thickness scales below 2 nm). High-κ materials include silicon oxide infused with a small amount of nitrogen (oxynitride), as well as titanium oxide, hafnium silicate, zirconium silicate, hafnium dioxide and zirconium dioxide, which are typically deposited using atomic layer deposition.

The gate stack 110 is the local backgate or bottom gate discussed herein. Gate stack 110 is referred to as backgate or bottom gate because it is at the "back" or "bottom" of CNT 106 layer. Gate stack 110 is referred to as local because it is located in and applies only to RF CNT FET device 100, as opposed to global backgate used in prior art (which acts as backgate to multiple FET devices). TEOS is tetraethyl orthosilicate, a chemical compound with the formula $Si(OC_2H_5)_4$. RF substrate 114 is a radio-frequency compatible substrate, e.g., an amorphous quartz wafer, a high resistivity silicon wafer, a silicon carbide wafer, or a sapphire wafer.

Figure 2D:
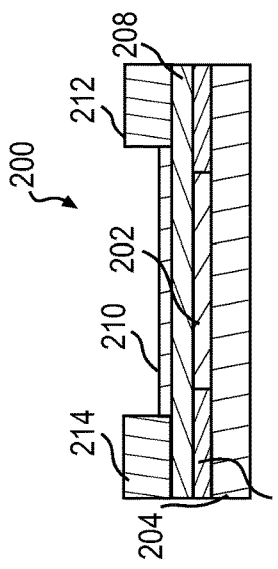

With reference now to FIGS. 2A-2G, shown are diagrams illustrating an embodiment of a method 200 for manufacturing an RF CNT FET device with a local backgate, such as RF CNT FET device 100. As shown in FIG. 2A, an RF compatible wafer 204 may be supplied. Multiple devices may be created across the entire wafer 204. Backgate structure or stack 202 is deposited on a RF compatible substrate 204 (e.g., an amorphous quartz wafer). Backgate structure 202 may include multiple backgate stacks deposited in a gate pattern on wafer 204 (e.g., multiple backgates for multiple devices, one or more for each device). In an embodiment, a relatively thin first or bottom layer of titanium is deposited on the surface of the substrate 204 to promote adhesion of the backgate stack to the substrate 204. A second layer of platinum is deposited on the first layer to act as a thermal diffusion barrier for the backgate stack. A third layer of gold is deposited on the second layer to crate a low conductivity path and reduce parasitic resistances in the backgate. Finally, in the embodiment, a fourth or top relatively thin layer of chrome is deposited on the third layer to act as a chemical mechanical polish (CMP) stop to protect the backgate in a later processing step. Consequently, in an embodiment, backgate stack 202 includes a relatively thin first or bottom layer of titanium (e.g., 5-20 nm), a second layer of platinum (e.g., 50-200 nm), a third layer of gold (e.g., 100 nm-500 nm) and relatively thin fourth or top layer of chrome (e.g., 10-50 nm).

With reference to FIG. 2B, in an embodiment, a layer of TEOS or other low-K conformal dielectric 206 is deposited onto entire wafer 204 (including on top of each backgate structure 202). TEOS layer may be grown using a standard chemical vapor deposition (CVD) process. A CVD TEOS process deposits a very rough film that is to be smoothed out for future processing steps. TEOS layer may be CVD deposited $SiO_2$. Consequently, entire TEOS (or other low-K dielectric layer) is polished (e.g., using CMP) until chrome CMP stop layer on backgate stack 202 is reached. Because chrome is much more difficult to polish than TEOS, the CMP action effectively stops on the top layer of backgate stack 202. Alternatively, CMP of TEOS layer may be stopped when TEOS surface is a few hundred nanometers above gate stack 202 surface. After checking the thickness of TEOS with, e.g., an ellipsometer, a reactive-ion etching (RIE) process with a very controlled etch rate may be used to remove more of the TEOS layer until the TEOS layer is flush with gate stack 202 surface. Either way, at this point, the top surface of TEOS layer is substantially flush with the top surface of the backgate stack 202, as shown in FIG. 2C resulting in a planar surface.

With reference to FIG. 2D, in an embodiment, a layer of high-κ dielectric 208 is deposited using atomic layer deposition, chemical vapor deposition, or a form of sputtering on top of the stack (i.e., on top of TEOS layer 206 and backgate stack 202). Prior to depositing dielectric 208, a removable photoresist layer may be deposited on probe pads and alignment marks on backgate stack 202, so that voltage may be later applied to backgate stack 202 and so CNTs for each device may be aligned with backgate stack 202. High-κ dielectric 208 layer is thick enough to allow reasonable stand-off voltages, but not so thick that gate control is lost on the semi-conducting CNTs. In embodiments, optimal thickness appears to range between 20-100 nm, although different thicknesses may apply for different dielectrics. In an embodiment, a 100 nm thick layer of $TiO_2$ is deposited. High-κ dielectric 208 layer surface should be reasonably smooth so that it is possible to bond CNTs to high-κ dielectric 208 layer.

Figure 2E:
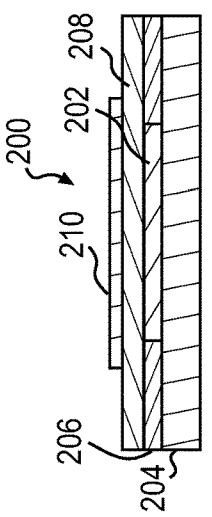

With reference to FIG. 2E, in an embodiment, aligned CNTs 210 are attached to surface of high-κ dielectric 208. In an embodiment, aligned CNTs 210 are previously grown and are attached to high-κ dielectric 208 surface using a standard CNT transfer process. As grown, two-thirds of CNTs 210 are semi-conducting tubes and one-third of CNTs 210 are metallic tubes. A standard CNT transfer and growth process grows aligned arrays of CNTs on an ST-cut crystalline quartz wafer (a ST-cut is a particular crystal cut through crystalline quartz that is relatively stable over changes in temperature). A layer of gold, polyimide and thermal release tape is applied to the CNTs. Lifting the gold, polyimide and thermal release tape layer from ST-cut quartz removes CNTs. This layer is then applied to surface of high-κ dielectric 208. Gold, polyimide and thermal release tape layer is then removed from CNTs. The thermal release tape is removed using a hot-plate (the tape loses adhesion at a sufficient temperature), the polyimide is removed using an oxygen plasma etch, and the gold is removed using potassium iodide.

Figure 2F:
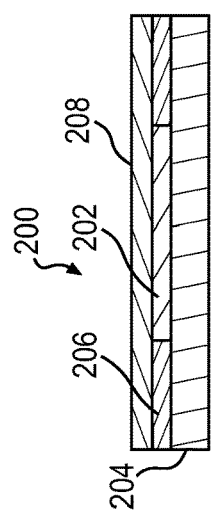

With reference to FIG. 2F, in an embodiment, source contact 212 and drain contact 214 are deposited. In an embodiment source contact 212 and drain contact 214 are deposited using a lift-off photomask. In other words, a photomask is applied to CNTs 210. Contact material for source contact 212 and drain contact 214 is deposited onto wafer stack. Photomask, which protects CNTs 210, is lifted-off CNTs 210, re-exposing CNTs 210 and leaving source contact 212 and drain contact 214. In an embodiment, contact material may be Ti/Pd or only Pd.

Figure 2G:
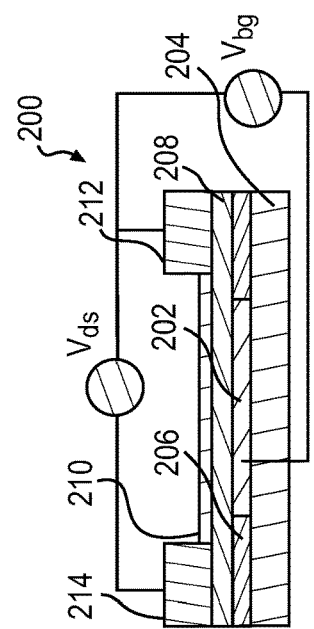

After deposition of source contact 212 and drain contact 214, physical construction of RF CNT FET device is complete. However, metallic tubes of CNTs 210 are still active and present in RF CNT FET device. With reference to FIG. 2G, in an embodiment, a standard backgate electrical burn-out process may be used to remove the metallic tubes. A backgate voltage $V_{bg}$ is applied to backgate stack 202 (e.g., to probe pads of backgate stack 202 protected by photoresist as described above) and used to deplete semi-conducting tubes of CNTs 210 so that semi-conducting tubes do not conduct current (the metallic tubes have either zero or a very small bandgap and the source-drain current does not substantially vary with their channel potential. The semi-conducting tubes have a bandgap which allows the current through the channel to be modulated in the same way that a typical FET allows a channel potential induced current modulation). A large voltage $V_{ds}$ is then applied between source contact 212 and drain contact 214, causing metallic tubes to conduct a large current. Because the metallic tubes are exposed to oxygen, metallic tubes oxidize due to ohmic heating and are removed from RF CNT FET device. As semi-conducting tubes do not conduct current, semi-conducting tubes do not oxidize and remain. After this electrical burnout, RF CNT FET device is complete and local backgate may be used as an RF gate. In a typical CNT FET, where metallic tube removal is used, there are two separate gates. The first gate is the global backgate used in the burnout process. The second gate is typically a local top-gate that we actually use when we operate the device in an RF configuration. The point made in this paragraph is that the local backgate now serves both purposes. Furthermore, by eliminating the global backgate, embodiments do not have a residual global gate that serves no purpose (other than adding parasitic capacitance) once the metallic tubes are removed.

Figure 3:
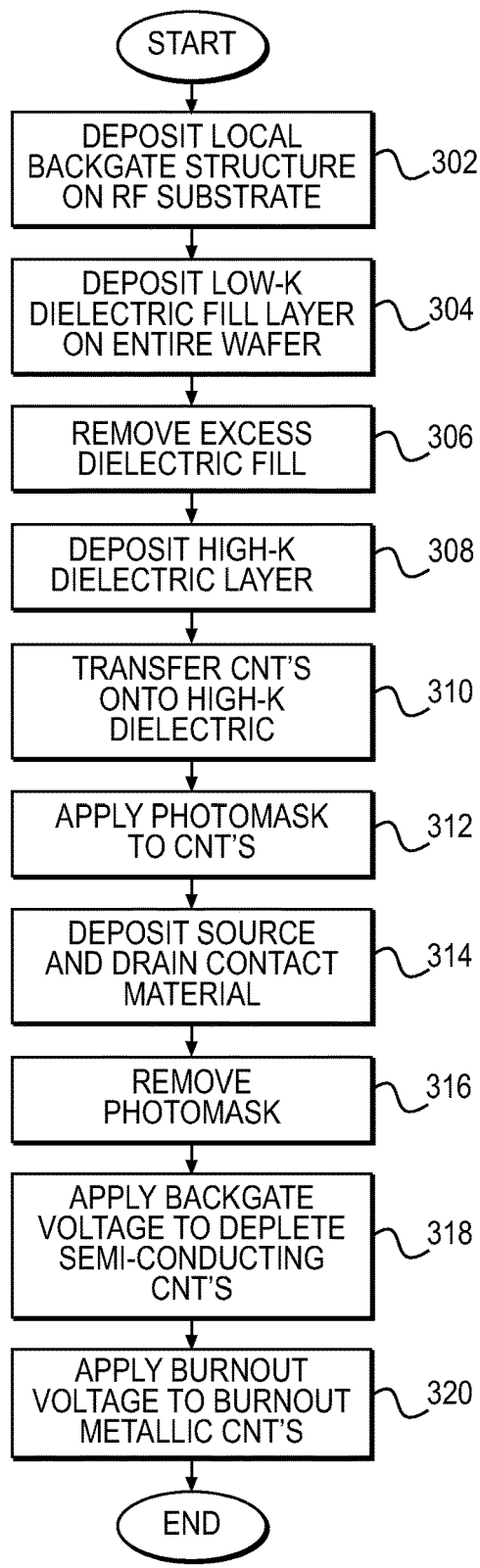
FIG. 3 is a flowchart illustrating an embodiment of a method of making a radio-frequency (RF) carbon-nanotube (CNT) field effect transistor (FET) device with local backgate.

With reference now to FIG. 3, shown is a flowchart illustrating an embodiment of a method 300 for manufacturing a RF CNT FET device with a local backgate, such as RF CNT FET device 100. Method 300 may correspond to steps illustrated in FIGS. 2A-2G. Method 300 deposits local backgate structure on provided RF compatible substrate, block 302. As noted, depositing gate structure 302 may include a four-layer deposition process depositing titanium, platinum, gold and then chrome. Furthermore, depositing gate structure 302 may include patterning and depositing multiple gate stacks on substrate.

Method 300 deposits TEOS or other low-κ dielectric fill layer on entire wafer (substrate and gate structure), block 304. Excess TEOS is removed and planarized until substantially level with top of gate structure, block 306, e.g., using CMP and/or RIE. High-κ dielectric layer, e.g., $TiO_2$, is deposited on top of TEOS and backgate structure, block 308. CNTs are transferred or otherwise placed onto high-κ dielectric layer, block 310. A photomask (a layer of photoresist) may be applied to CNTs, block 312, before source and drain contact material is deposited on stack, block 314. Photomask is removed, block 316, to re-expose CNTs.

With continued reference to FIG. 3, a backgate voltage is applied to backgate stack depleting semi-conducting tubes of CNTs, block 318. A burnout voltage is applied to source and drain contacts, burning out metallic tubes of CNTs, block 320. After this electrical burnout, RF CNT FET device is complete and local backgate may be used as an RF gate.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. A method for making a radio-frequency (RF) carbon-nanotube (CNT) field effect transistor (FET) device comprising:
   depositing a local backgate structure on a RF compatible substrate, wherein depositing the local backgate structure includes:
      depositing a thin titanium layer;
      depositing a platinum layer on top of the titanium layer;
      depositing a gold layer on top of the platinum layer; and
      depositing chrome on top of the gold layer;
   depositing high-κ gate dielectric layer on top of the local backgate structure;
   depositing CNTs on the high-κ gate dielectric layer, wherein the CNTs include metallic and semi-conducting CNTs;
   depositing source and drain contacts adjacent to CNTs;
   applying a voltage to the local backgate sufficient to deplete the semi-conducting CNTs; and
   applying a voltage to the source and drain contacts sufficient to burn-out the metallic CNTs, wherein the metallic CNTs are removed.

2. A method for making a radio-frequency (RF) carbon-nanotube (CNT) field effect transistor (FET) device comprising:
   depositing a local backgate structure on a RF compatible substrate, wherein depositing the local backgate structure includes patterning and depositing multiple gate stacks on substrate;
   depositing high-κ gate dielectric layer on top of the local backgate structure;
   depositing CNTs on the high-κ gate dielectric layer, wherein the CNTs include metallic and semi-conducting CNTs;
   depositing source and drain contacts adjacent to CNTs;
   applying a voltage to the local backgate sufficient to deplete the semi-conducting CNTs; and
   applying a voltage to the source and drain contacts sufficient to burn-out the metallic CNTs, wherein the metallic CNTs are removed.

3. A method for making a radio-frequency (RF) carbon-nanotube (CNT) field effect transistor (FET) device comprising:
   depositing a local backgate structure on a RF compatible substrate;
   depositing high-κ gate dielectric layer on top of the local backgate structure;
   depositing CNTs on the high-κ gate dielectric layer, wherein the CNTs include metallic and semi-conducting CNTs;
   depositing source and drain contacts adjacent to CNTs;
   applying a photomask to CNTs prior to depositing source and drain contacts;
   applying a voltage to the local backgate sufficient to deplete the semi-conducting CNTs; and
   applying a voltage to the source and drain contacts sufficient to burn-out the metallic CNTs, wherein the metallic CNTs are removed.

4. A method for making a radio-frequency (RF) carbon-nanotube (CNT) field effect transistor (FET) device comprising:
   depositing a local backgate structure on a RF compatible substrate, wherein the RF compatible substrate is an amorphous quartz wafer, a high resistivity silicon wafer, a silicon carbide wafer, or a sapphire wafer;
   depositing high-κ gate dielectric layer on top of the local backgate structure;
   depositing CNTs on the high-κ gate dielectric layer, wherein the CNTs include metallic and semi-conducting CNTs;
   depositing source and drain contacts adjacent to CNTs;
   applying a voltage to the local backgate sufficient to deplete the semi-conducting CNTs; and
   applying a voltage to the source and drain contacts sufficient to burn-out the metallic CNTs, wherein the metallic CNTs are removed.

* * * * *